(12) United States Patent
Daigle et al.

(10) Patent No.: US 8,598,913 B2
(45) Date of Patent: Dec. 3, 2013

(54) REDUCED TEMPERATURE DEPENDENT HYSTERETIC COMPARATOR

(75) Inventors: Tyler Daigle, Portland, ME (US); Andrew M. Jordan, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/301,990

(22) Filed: Nov. 22, 2011

(65) Prior Publication Data

US 2012/0126855 A1    May 24, 2012

Related U.S. Application Data

(60) Provisional application No. 61/416,121, filed on Nov. 22, 2010.

(51) Int. Cl.
*H03K 5/22* (2006.01)

(52) U.S. Cl.
USPC ............... 327/66; 327/65; 327/67; 327/54; 327/138

(58) Field of Classification Search
USPC ......... 327/66, 65, 67, 52, 53, 54, 55, 57, 138, 327/335, 538, 539
See application file for complete search history.

(56) References Cited

U.S. PATENT DOCUMENTS

| | | | |
|---|---|---|---|
| 5,894,245 A * | 4/1999 | Cho | 330/253 |
| 6,052,025 A * | 4/2000 | Chang et al. | 330/253 |
| 6,208,187 B1 * | 3/2001 | Callahan, Jr. | 327/206 |
| 6,822,513 B1 * | 11/2004 | Li et al. | 330/253 |
| 2007/0194850 A1 * | 8/2007 | Lin et al. | 330/260 |
| 2010/0045268 A1 * | 2/2010 | Kilian | 324/207.2 |

* cited by examiner

*Primary Examiner* — Lincoln Donovan
*Assistant Examiner* — Jung H. Kim
(74) *Attorney, Agent, or Firm* — Schwegman Lundberg & Woessner P.A.

(57) ABSTRACT

This document discusses, among other things, apparatus and methods for controlling a hysteresis range of a voltage comparator. In an example, an apparatus can include an amplifier having a temperature dependency, a comparator configured to receive first and second currents and to provide an output voltage indicative of a hysteretic comparison of the first and second input voltages, wherein a range of hysteresis of the apparatus is controlled over a range of temperatures. In an example, the amplifier can be configured to receive first and second input voltages and to provide the first and second currents.

18 Claims, 3 Drawing Sheets

REDUCED TEMPERATURE DEPENDENT HYSTERETIC COMPARATOR

CLAIM OF PRIORITY

This patent application claims the benefit of priority, under 35 U.S.C. Section 119(e), to Daigle et al., U.S. Provisional Patent Application Ser. No. 61/416,121, entitled "VOLTAGE REFERENCE COMPARATOR WITH TEMPERATURE INDEPENDENT HYSTERESIS," filed on Nov. 22, 2010, which is hereby incorporated by reference herein in its entirety.

BACKGROUND

Electric devices can be subjected to a wide variety of environments including a wide variety of temperatures that can change drastically over a relatively short period of time, such as when entering or leaving a warm building in the winter. Temperature dependencies of various electronic components of the electronic devices, such as voltage comparators used to detect various events associated with the electronic devices, can limit the performance of the electronic devices or accessories associated with the electronic devices.

OVERVIEW

This document discusses, among other things, apparatus and methods for controlling a hysteresis range of a voltage comparator over a range of temperatures. In an example, an apparatus can include an amplifier having a temperature dependency, a comparator configured to receive first and second currents and to provide an output voltage indicative of a hysteretic comparison of first and second input voltages, wherein a range of hysteresis of the apparatus is controlled over a range of temperatures. In an example, the amplifier can be configured to receive the first and second input voltages and to provide the first and second currents.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, a circuit, such as a voltage comparator circuit, configured to provide a controlled hysteresis range at an output over a range of temperatures. In certain examples, the controlled hysteresis range does not vary with temperature. In an example, the circuit can be configured to receive voltage inputs at or up to an upper rail voltage and at or down to a lower rail voltage. In an example, the circuit does not require the use of a second reference voltage, such as a band gap voltage reference, to provide hysteresis including providing a hysteresis range that is substantially independent of temperature. Thus, the circuit can provide improved hysteretic voltage comparison information over a wide temperature range without increasing die size or using additional power associated with a second voltage reference, such as a voltage reference to provide a second hysteretic voltage threshold. In an example, the circuit can provide an improved common mode range such that the common mode range can operate from rail to rail minus one ($V_{th}+V_{ds}$).

In an example, the circuit can include a differential input pair in a folded cascode amplifier configuration with a positive feedback latching (e.g. hysteresis) circuit. In an example, the folded cascode amplifier configuration can allow for functionality with common mode inputs at or close to a rail voltage. In certain examples, the circuit can include a temperature compensation component to control a range of the hysteresis of the circuit over a range of temperatures. In an example, the range of hysteresis of the circuit, for a given differential input voltage, can vary less than about 0.01 volts over a temperature range of about 125 degrees Celsius (e.g., from about −40 degrees Celsius to about 85 degrees Celsius).

The circuit can be used in a variety of electronic devices including personal mobile electronic devices susceptible to relatively quickly changing temperatures. In certain examples, the circuit can provide robust performance to detect various signal changes of a mobile electronic device, for example, signal changes associated with user interface actions or signal changes associated with accessory devices or sensor devices.

Figure 1:
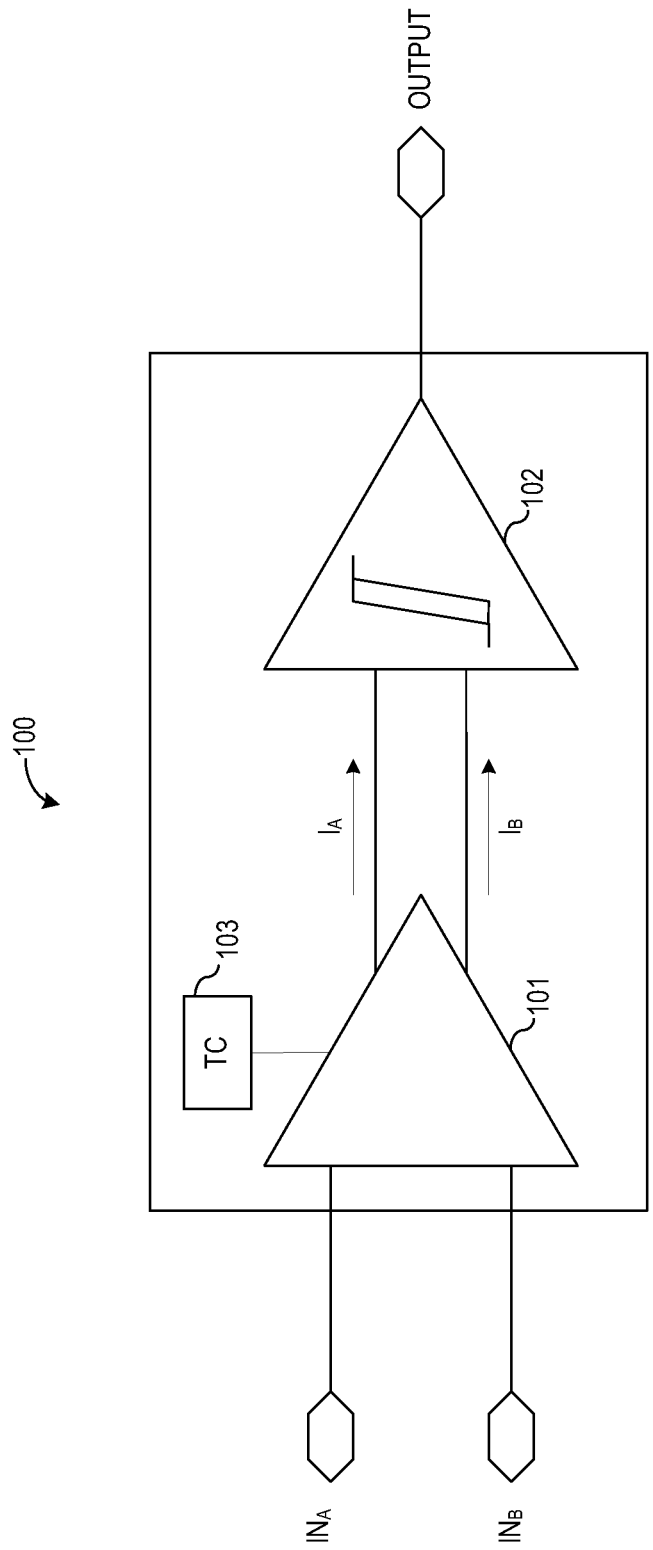
FIG. 1 illustrates generally a block diagram example of a comparator with temperature independent hysteresis.

FIG. 1 illustrates generally a block diagram of an example hysteretic voltage comparator circuit 100. In certain examples, the hysteretic voltage comparator circuit 100 can include a transconductance amplifier 101, a hysteretic current comparator 102, and a temperature compensation component 103. In an example, the transconductance amplifier 101 can compare an input voltage $V_A$ to a reference voltage $V_B$ and provide a differential current output $I_A$, $I_B$ indicative of the value of input voltage $V_A$ with respect to the reference voltage $V_B$. In an example, the transconductance amplifier 101 can receive a differential voltage $V_A$-$V_B$, and can provide a differential current output $I_A$, $I_B$ indicative of a magnitude of the differential voltage $V_A$-$V_B$. The hysteretic current comparator 102 can receive the differential current output of the transconductance amplifier 101, and can provide a discrete output indicative of the magnitude of the differential voltage $V_A$-$V_B$. In certain examples, the output of the hysteretic converter can transition from a first state to a second state as the difference between the input voltages increases through a first threshold, and can transition from the second state as the difference between the input voltages decreases through a second threshold. In certain examples the first threshold includes a higher value than the second threshold.

In an example, the transconductance amplifier 101 can include a temperature compensation component 103. The temperature compensation component 103 can provide a bias to the transconductance amplifier 101, such that for given input voltage difference $V_A$-$V_B$ the corresponding output currents $I_A$, $I_B$ can remain substantially unchanged over a wide range of temperature. In an example, a temperature coefficient associated with the temperature compensation component 103 can be selected to track, in an opposite manner, a temperature dependency of the transconductance amplifier 101 as the temperature of the circuit varies. Such a temperature coefficient can at least partially reduce the magnitude of the overall temperature coefficient of the transconductance amplifier 101 and thus, reduce the temperature dependency of the hysteretic voltage comparator circuit 100.

In certain examples, an integrated circuit can include the transconductance amplifier 101 and the hysteretic current comparator 102. In an example, an integrated circuit can include the transconductance amplifier 101, the hysteretic current comparator 102, and the temperature compensation component 103.

Figure 2:
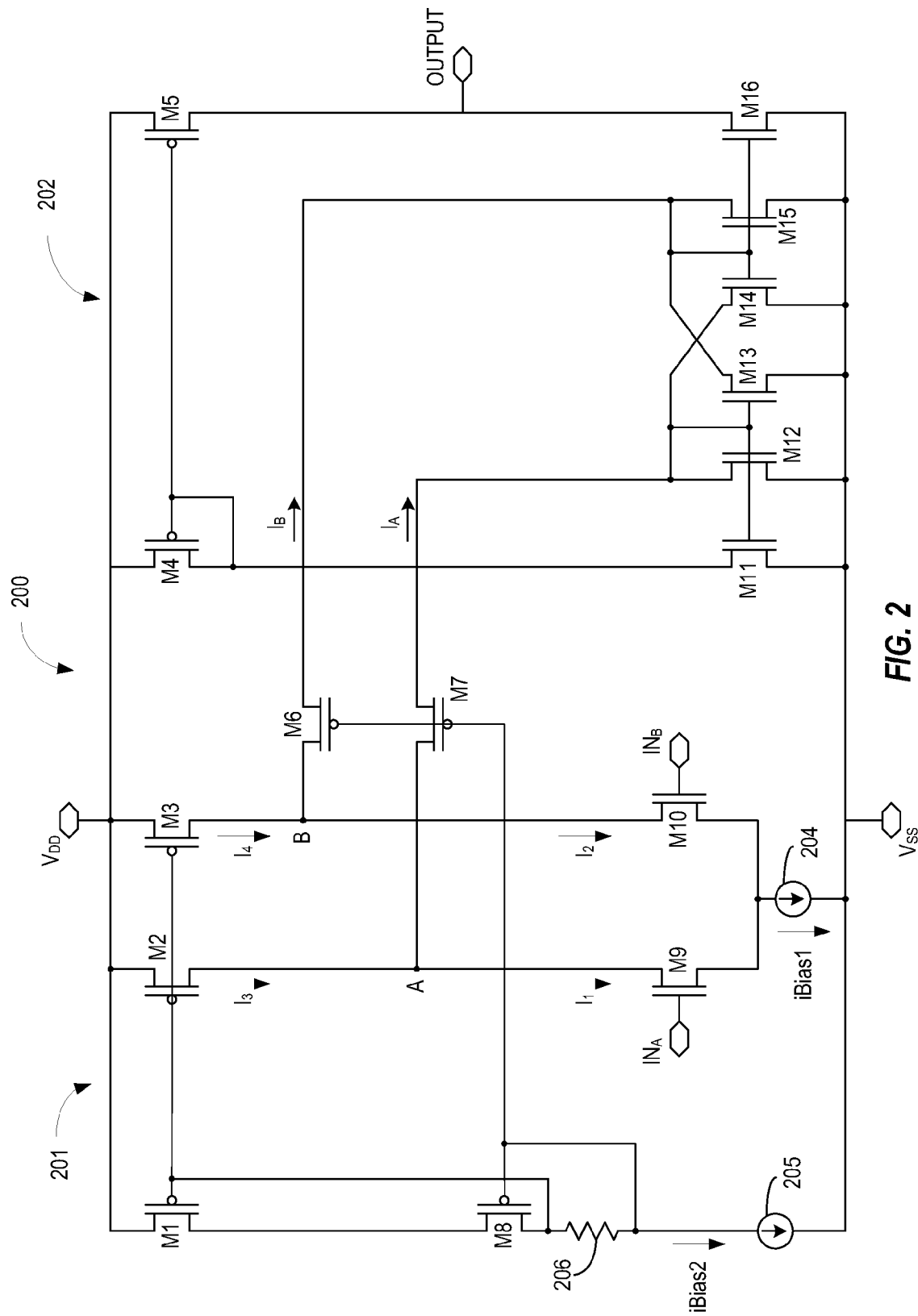
FIG. 2 illustrates generally an example comparator circuit with temperature independent hysteresis.

FIG. 2 illustrates generally an example of a hysteretic voltage comparator circuit 200. In certain examples, the hysteretic voltage comparator circuit 200 can include a transconductance amplifier 201, such as a folded cascade transconductance amplifier, and a hysteretic current comparator circuit 202. In an example, the transconductance amplifier 201 can include a current source including a resistor 206 and a plurality of transistors (e.g., M1, M2, M3, M6, M7, M8, M9, and M10, etc.). The transconductance amplifier 201 can provide current summing junctions A, B to provide a differential current output $I_A$, $I_B$ to the hysteretic current comparator circuit 202 in response to a differential voltage $IN_A$, $IN_B$ received at the inputs of the transconductance amplifier 201. Current summing can allow currents $I_{1,2}$ and $I_{3,4}$ to be set independently to provide temperature independent hysteresis. In an example, transistors M2 and M3 can have a multiplier J larger than M1, and thus, currents $I_3$ and $I_4$ can be J times larger than a bias current, such as a second bias current iBias2 illustrated in FIG. 2. Transistors M13 and M14 of the hysteretic current comparator circuit 202 can have a multiplication factor X over that of corresponding transistors M12 and M15. In an example, selection of the multiplication factor X can assist in establishing an upper threshold and a lower threshold of the hysteretic current comparator circuit 202. For example, at a threshold of toggle of the hysteretic voltage comparator circuit 200, the hysteresis amount can be given by:

$$I_{A,B} = \frac{x(I_A + I_B)}{x+1},$$

$$I_{B,A} = \frac{(I_A + I_B)}{x+1},$$

$$\Delta I_{A,B} = |I_A - I_B| = \frac{(x-1)(I_A + I_B)}{(x+1)},$$

$$\Delta I_{A,B} = \Delta I_{1,2},$$

$$\Delta I_{B,A} = \Delta Vin \cdot g_{m9,10},$$

$$\Delta Vin = \frac{V_{HYST}}{2},$$

$$\Delta Vin = |IN_A - IN_B|,$$

$$V_{HYST} = 2 \cdot \Delta Vin,$$

$$V_{HYST} = \frac{2(x-1)(I_A + I_B)}{(x+1)g_{m9,10}}.$$

For temperature independent hysteresis:

$$\delta V_{HYST}/\delta T = 0.$$

For the example voltage comparator circuit 200, $$x = \frac{M_{13,14}}{M_{12,15}},$$

and $I_A = (I_3 - I_1)$ and $I_B = (I_4 - I_2)$. Thus, $$\frac{\delta V_{HYST}}{\delta T} = Const \cdot \frac{\delta}{\delta T}\left(\frac{I_A - I_B}{g_{m9,10}}\right) = 0.$$

This can be achieved in several ways, for example, $$\frac{\delta(I_A + I_B)}{\delta T} \text{ and } \frac{\delta m_{g9,10}}{\delta T}$$

each can be set equal to zero. Alternatively, $$\frac{\delta(I_A + I_B)}{\delta g_{m9,10}}$$

can be set equal to $$\frac{(I_A + I_B)}{g_{m9,10}}.$$

Constant hysteresis can be achieved by keeping all components of the hysteresis equation constant. For example, $$V_{HYST} = \frac{2(x-1)(I_A + I_B)}{(x+1)g_{m9,10}}, \text{ where}$$

$$\frac{\delta(I_A + I_B)}{\delta T} = 0, \text{ and}$$

$$\frac{\delta g_{m9,10}}{\delta T} = 0.$$

Generally, $$g_m = \sqrt{2\mu(T)C_{ox}\frac{W}{L}I_D},$$

where
$\mu$=mobility of the carrier,
W=channel width,
L=channel length, $$C_{OX} = \frac{\varepsilon_{ox}}{t_{ox}}$$

and is a constant where $\varepsilon_{ox}$ can equal permittivity of a silicon oxide of the transistor and $t_{ox}$ can equal thickness of an oxide layer of the transistor, and
T=temperature.

A temperature coefficient tc1 based on a first bias current source 204 configured to provide a first bias current iBias1 can be created that is equal and opposite to the natural temperature coefficient of $g_{m_{9,10}}$. This can ensure a constant $g_{m_{9,10}}$ over a range of temperature variation. In an example, $$2I_D = i\text{Bias}1(1+tc1(T-25)), \text{ where}$$

T=temperature.

Therefore, in an example circuit, a temperature compensation component can include a first bias current source 204 configured with the temperature coefficient tc1 to compensate for at least a portion of the temperature dependency of the transconductance of transistors M9 and M10. Providing a first bias current source 204 to compensate for a temperature dependency of the transconductance of transistors M9 and M10 can ensure that the difference between currents $I_1$ and $I_2$ is substantially constant over a wide temperature range. However, in certain examples, the temperature coefficient tc1 of the first bias current source 204 can become dominant such that the sum of currents $I_1$ and $I_2$ can vary over the desired temperature range. In certain examples, the temperature dependence of the first bias current source 204 can contribute to a temperature dependence of $I_A$ and $I_B$.

In an example, a temperature coefficient tc2 based on a second bias current source 205 configured to provide a second bias current iBias2 can be created. The temperature coefficient tc2 can be based on, for example, one or more of the following:

(1) The second bias current source 205 can have a multiplier of J through sizing of M2, M3 to M1 of FIG. 2.
(2) The second bias current iBias2 of the second bias current source 205 at room temperature can be 1/K times the first bias current iBias1 of the first bias current source 204 at room temperature.
(3) A temperature coefficient tc2 of the second bias current source 205 can be 1/L times the temperature coefficient tc1 of the first bias current source 204.
(4) J, K, and L can satisfy the equation J=KL/2.

At common mode, the first order temperature coefficient can be canceled using the following equations:

$$I_A = I_B = J \cdot i\text{Bias}2(1 + tc2(T - T_{nom})) - \frac{1}{2}i\text{Bias}1(1 + tc2(T - T_{nom})),$$

$$ibias1 = K \cdot i\text{Bias}2,$$

$$tc1 = L \cdot tc2,$$

$$I_A = I_B = J \cdot i\text{Bias}2(1 + tc2(T - T_{nom})) - \frac{K}{2}i\text{Bias}2(1 + L \cdot tc2(T - T_{nom})),$$

$$I_A = I_B = (J \cdot i\text{Bias}2) + (J \cdot i\text{Bias}2 \cdot tc2(1 - T_{nom})) -$$

$$\left(\frac{K}{2}i\text{Bias}2\right) - \left(\frac{K \cdot L}{2}i\text{Bias}2 \cdot tc2(T - T_{nom})\right).$$

From above, $$J = \frac{KL}{2},$$

thereof, $$I_A = I_B = \left(J - \frac{K}{2}\right)i\text{Bias}2.$$

Accordingly, currents $I_A$ and $I_B$ are not dependent on temperature, T.

Figure 3:
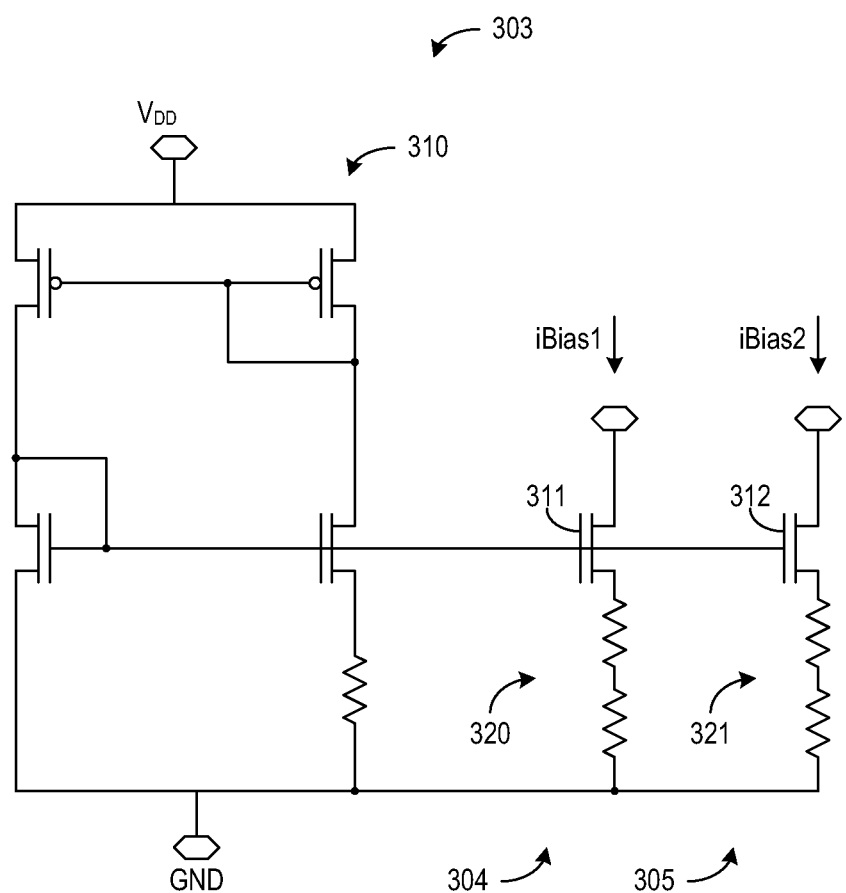
FIG. 3 illustrates generally an example temperature compensation component.

FIG. 3 illustrates generally an example of a temperature compensation component 303 including a self-biased reference 310 and one or more output mirror transistors 311, 312. In an example, the temperature compensation component 303 can include an output mirror transistor 311 that can form a portion of a first bias current source 304 to provide a temperature coefficient configured to at least partially compensate for a temperature dependence of a transconductance amplifier. In an example, the temperature compensation component 303 can include an output mirror transistor 312 that can form a portion of a second bias current source 305 to provide a temperature coefficient configured to compensate for at least a portion of a temperature dependence of the transconductance amplifier using the first bias current source 304. In certain examples, the temperature compensation component 303 can include the first bias current source and the second bias current source. In an example, the first bias current source 304 can be separate from the second bias current source 305.

In an example, the first bias current source 304 can include a resistance 320. The resistance 320 can be selected to have a temperature coefficient tc1 that can at least partially compensate for an overall magnitude of a temperature dependence of the transconductance amplifier of FIG. 2. In certain examples, the resistance 320 can include more than one resistor to allow fine tuning of the temperature coefficient tc1 of the first bias current source 304.

In an example, the second current bias source 305 can include a resistance 321. The resistance 321 of the second bias current source 305 can be selected to have a temperature coefficient tc2 that can at least partially compensate for an overall magnitude of a temperature dependence of the transconductance amplifier of FIG. 2. In certain examples, the resistance 321 can include more than one resistor. In certain examples, the resistance 320, 321 of the first or second bias current sources 304, 305 can include a semiconductor resistor, such as a diffused resistor or a polysilicon resistor.

Additional Notes

In Example 1, an apparatus can include an amplifier having a temperature dependency, the amplifier configured to receive first and second input voltages and to provide first and second currents, a comparator configured to receive the first and second currents and to provide an output voltage indicative of a hysteretic comparison of the first and second input voltages, and wherein a range of hysteresis of the apparatus is controlled over a range of temperatures.

In Example 2, the apparatus of Example 1 optionally includes a temperature compensation component configured to compensate for at least a portion of the temperature dependency of the amplifier and to control the range of hysteresis over range of temperatures.

In Example 3, the amplifier of any one or more of Examples 1-2 optionally includes first and second input transistors having a transconductance with a first temperature coefficient, wherein the temperature compensation component of any one or more of Examples 1-2 optionally includes a first bias current source having a second temperature coefficient, wherein the second temperature coefficient is configured to at least partially compensate for the first temperature coefficient.

In Example 4, the first bias current source of any one or more of Examples 1-3 is optionally configured to bias the first and second input transistors.

In Example 5, the amplifier of any one or more of Examples 1-4 optionally includes a second bias current source configured to at least partially compensate for the temperature dependency of the first bias current source.

In Example 6, the second current bias source of any one or more of Examples 1-5 optionally includes a first current mirror, the first current mirror including a first sense transistor, a first mirror transistor and first and second resistors coupled to the first mirror transistor.

In Example 7, the first and second resistors of the second current bias source of any one or more of Examples 1-6 optionally include first and second resistor temperature coefficients to at least partially compensate for the temperature dependency of the amplifier.

In Example 8, the first current bias source of any one or more of Examples 1-7 optionally includes a second current mirror, the second current mirror including a second sense transistor, a second mirror transistor and third and fourth resistors coupled to the second mirror transistor.

In Example 9, the third and fourth resistors of the second current bias source of any one or more of Examples 1-8 optionally include third and fourth resistor temperature coefficients configured to at least partially compensate for the first temperature coefficient.

In Example 10, the first sense transistor and the second sense transistor of any one or more of Examples 1-9 are optionally a single sense transistor.

In Example 11, the first current bias source of any one or more of Examples 1-10 optionally includes a current mirror, the current mirror including a sense transistor, a mirror transistor and first and second resistors coupled to the mirror transistor.

In Example 12, the first and second resistors of the first current bias source of any one or more of Examples 1-11 optionally include first and second resistor temperature coefficients configured to at least partially compensate for the first temperature coefficient.

In Example 13, the amplifier of any one or more of Examples 1-12 optionally includes a current mirror and first and second input transistors, wherein the current mirror is configured to provide current to the first and second input transistors.

In Example 14, the amplifier of any one or more of Examples 1-13 optionally includes a cascode amplifier.

In Example 15, the amplifier of any one or more of Examples 1-14 optionally includes a folded cascode amplifier.

In Example 16, the amplifier of any one or more of Examples 1-2 optionally includes a differential folded cascode amplifier.

In Example 17, a method of any one or more of Examples 1-16 can include receiving first and second input voltages at an amplifier, providing first and second currents using the first and second voltages and the amplifier, comparing the first and second currents using a hysteretic comparator, providing an output voltage indicative of a hysteretic comparison of the first and second input voltages using the comparison of the first and second currents, and controlling a range of hysteresis of hysteretic comparison over a range of temperatures.

In Example 18 the controlling the range of hysteresis of any one or more of Examples 1-17 optionally includes biasing first and second input transistors of the amplifier using a first current source configured to at least partially compensate for first temperature coefficient of a transconductance of the first and second input transistors.

In Example 19, the controlling the range of hysteresis of any one or more of Examples 1-18 optionally includes biasing a current mirror of the amplifier using a second current source configured to at least partially compensate for a temperature dependency of the current mirror.

In Example 20, the receiving the first and second voltages of any one or more of Examples 1-19 optionally includes receiving the first and second voltages at a differential folded cascode amplifier, and the providing first and second currents of any one or more of Examples 1-19 optionally includes providing first and second currents using the first and second voltages and the differential folded cascode amplifier.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
an amplifier having a temperature dependency, the amplifier configured to receive first and second input voltages and to provide first and second currents;
a comparator configured to receive the first and second currents and to provide an output voltage indicative of a hysteretic comparison of the first and second input voltages;
a temperature compensation component configured to reduce the temperature dependency of the amplifier over a range of temperatures and to reduce a temperature dependency of a range of hysteresis over the range of temperatures; and
wherein the amplifier includes a cascode amplifier.

2. The apparatus of claim 1, wherein the amplifier includes first and second input transistors having a transconductance with a first temperature coefficient;
wherein the temperature compensation component includes a first bias current source having a second temperature coefficient; and
wherein the second temperature coefficient is configured to at least partially compensate for the first temperature coefficient and to reduce the temperature dependency of the amplifier.

3. The apparatus of claim 2, wherein the first bias current source is configured to bias the first and second input transistors.

4. The apparatus of claim 2, wherein the amplifier includes a second bias current source configured to at least partially compensate for the temperature dependency of the first bias current source.

5. The apparatus of claim 4, wherein the second bias current source includes a first current mirror, the first current mirror including a first sense transistor, a first mirror transistor and first and second resistors coupled to the first mirror transistor.

6. The apparatus of claim 5, wherein the first and second resistors of the second bias current source include first and second resistor temperature coefficients to at least partially compensate for the temperature dependency of the amplifier.

7. The apparatus of claim 6, wherein the first bias current source includes a second current mirror, the second current mirror including a second sense transistor, a second mirror transistor and third and fourth resistors coupled to the second mirror transistor.

8. The apparatus of claim 7, wherein the third and fourth resistors of the second bias current source include third and fourth resistor temperature coefficients configured to at least partially compensate for the first temperature coefficient.

9. The apparatus of claim 7, wherein the first sense transistor and the second sense transistor are a single sense transistor.

10. The apparatus of claim 2, wherein the first bias current source includes a current mirror, the current mirror including a sense transistor, a mirror transistor and first and second resistors coupled to the mirror transistor.

11. The apparatus of claim 10, wherein the first and second resistors of the first bias current source include first and second resistor temperature coefficients configured to at least partially compensate for the first temperature coefficient.

12. The apparatus of claim 1, wherein the amplifier includes a current mirror and first and second input transistors, wherein the current mirror is configured to provide current to the first and second input transistors.

13. The apparatus of claim 1, wherein the amplifier includes a folded cascode amplifier.

14. The apparatus of claim 1, wherein the amplifier includes a differential folded cascode amplifier.

15. A method comprising:
receiving first and second input voltages at an amplifier;
providing first and second currents using the first and second voltages and the amplifier;
comparing the first and second currents using a hysteretic comparator;
providing an output voltage indicative of a hysteretic comparison of the first and second input voltages using the comparison of the first and second currents;
controlling a range of hysteresis of hysteretic comparison over a range of temperatures,
wherein the controlling the range of hysteresis includes biasing first and second input transistors of the amplifier using a first current source configured to reduce a temperature dependency of the first and second input transistors and to at least partially compensate for a first temperature coefficient of a transconductance of the first and second input transistors;
wherein the receiving the first and second voltages includes receiving the first and second voltages at a differential folded cascode amplifier; and
wherein the providing first and second currents includes providing first and second currents using the first and second voltages and the differential folded cascode amplifier.

16. The method of claim 15, wherein the controlling the range of hysteresis includes biasing a current mirror of the amplifier using a second current source configured to reduce a temperature dependency of the current mirror.

17. The apparatus of claim 1, wherein a temperature dependence of the range of hysteresis is about 0.01 volts and the range of temperature is about 125 degrees Celsius.

18. The method of claim 15, wherein the controlling a range of hysteresis of hysteretic comparison over a range of temperatures, includes controlling the range of hysteresis to within about 0.01 volts over a range of temperatures of about 125 degrees Celsius.

* * * * *